United States Patent [19]
Leduc

[11] Patent Number: 5,200,803
[45] Date of Patent: Apr. 6, 1993

[54] INTEGRATED CIRCUIT HAVING A LATERAL MULTICOLLECTOR TRANSISTOR

[75] Inventor: Pierre Leduc, Colleville-Montgomery, France

[73] Assignee: U.S. Philips Corp., New York, N.Y.

[21] Appl. No.: 690,442

[22] Filed: Apr. 23, 1991

[30] Foreign Application Priority Data

Apr. 27, 1990 [FR] France .................................. 90 05413

[51] Int. Cl.$^5$ ...................... H01L 29/72; H01L 29/06; H01L 23/48
[52] U.S. Cl. .................................... 257/560; 257/593; 257/558; 257/592
[58] Field of Search ........................ 357/35, 34, 36, 43, 357/55, 68

[56] References Cited

U.S. PATENT DOCUMENTS 4,684,877  9/1987  Shreve et al. ........................... 357/35
4,951,108  9/1990  Leduc ..................................... 357/35

OTHER PUBLICATIONS

Berger et al; "Current Gain In Injection Transistor Structures"; May 1975; IBM Technical Disclosure Bulletin vol. 17. No. 12.

Primary Examiner—Rolf Hille
Assistant Examiner—Wael Fahmy
Attorney, Agent, or Firm—Steven R. Biren

[57] ABSTRACT

An integrated circuit includes a lateral transistor which has emitter regions (7) and collector regions (8) of a first conductivity type laterally spaced apart and included in a region (4, 5) of a second conductivity type opposed to the first. The lateral space (4) of the region (4, 5) of the second type situated between the emitter (7) and collector (8) regions forms the base of the transistor, with the emitter region (7) having a depth and a doping level which are such that the diffusion length of the minority carriers injected vertically therein is greater than or equal to the width of the region, which region has an elongate shape in at least a longitudinal direction, while the lateral transistor has its contour surrounded by a deep insulating layer (12). The collector (8) has at least two zones, between which is disposed an elongate portion (7) of the emitter region, with an additional region (9) of the first conductivity type adjoining the contour of the transistor and disposed between the contour of the transistor and the deep insulating layer (12) at least opposite to the ends (7') of the elongate portion of the emitter region.

6 Claims, 2 Drawing Sheets

INTEGRATED CIRCUIT HAVING A LATERAL MULTICOLLECTOR TRANSISTOR

BACKGROUND OF THE INVENTION

The invention relates to an integrated circuit comprising a lateral transistor having laterally spaced emitter and collector regions of a first conductivity type, which regions are provided in a region of a second conductivity type opposed to the first, while starting from the surface of the latter the lateral space of the said region of the second type situated between the emitter and the collector regions forms the base of the transistor, the emitter region having an elongate shape in at least a longitudinal direction, and the contour of the lateral transistor being surrounded by a deep insulating layer.

Such an integrated circuit is known from the French Patent Application filed on Dec. 30, 1987 under number 87 18388 (publication no. FR 2 625 611).

It is a limitation of such an integrated circuit that, if a collector is to be realized having several zones, transistors thus obtained show a manufacturing spread, particularly as regards the current gain.

SUMMARY OF THE INVENTION

The invention has for its object to provide an integrated circuit of the type described above in which the lateral transistor is of the multicollector type and which has a current gain which is more stable as regards manufacturing spread.

The problem of spread is avoided in a transistor of the type described above in that the collector region has at least two zones between which an elongate portion of the emitter region is disposed, while an additional region of the first conductivity type is provided bordering on the contour of the transistor and disposed between the contour of the transistor and the insulating layer at least opposite to extremities of the said elongate portion of the emitter region, and possibly bordering on the entire contour of the transistor.

The invention is based on the recognition that the problem of manufacturing spread is caused by the fact that the ends of the emitter branch(es) could "see" the deep insulating layer across a portion of the region of the second type. Since the contour of the deep insulating layer will show a spread in the manufacturing process, there will be a spread in the recombination current at its boundaries. Hence the injection currents are modified in the vicinity of the said ends at the emitter branches, causing a spread in the gains of the transistors within a manufacturing run.

It should be noted that in the present application the term "deep insulating layer" is meant to signify any insulation which is not of the junction type, in particular a groove whose sides are covered by an insulating layer.

According to a preferred embodiment, the distance between the ends of the said elongate portion and the said additional region is greater than the distance between the said elongate portion and the said collector zones. The current running through the additional region is minimized in this way. It is also preferable if the distance between the collector zones and the said additional region is greater than the distance between the said elongate portion and the said collector zones.

According to a particularly advantageous embodiment, the emitter region has the shape of a cross and comprises two branches disposed in a first and a second longitudinal direction, and at least four collector zones are disposed between the said branches.

BRIEF DESCRIPTION OF THE DRAWINGS

The invention will be better understood through the perusal of the following description which is given by way of non-limitative example with reference to the drawings, in which.

DESCRIPTION OF THE PREFERRED EMBODIMENTS

Figure 1:
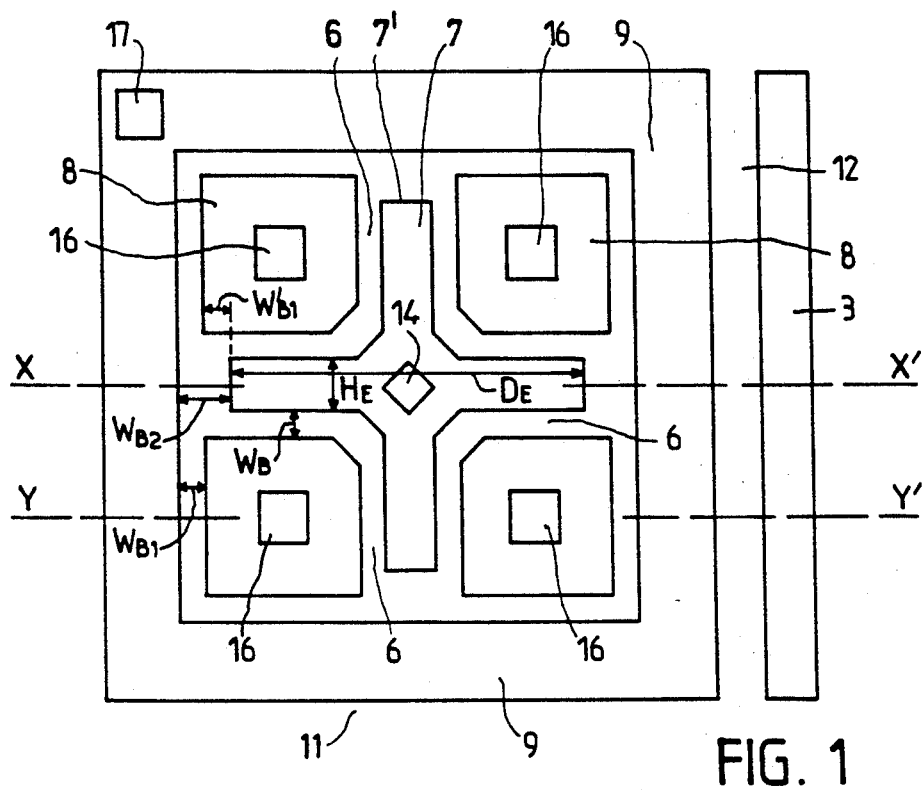
FIG. 1 shows a plan view of a preferred embodiment of the invention, FIGS. 2a and 2b giving vertical cross-sections taken on the lines XX' and YY', respectively, in FIG. 1.
Figure 2A:
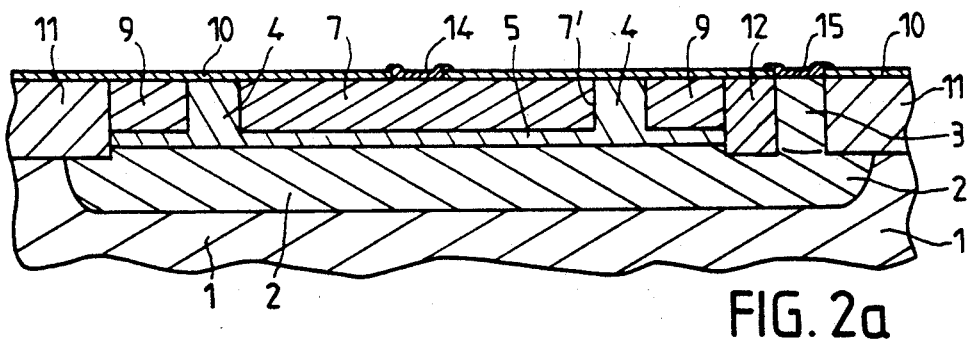
Figure 2B:
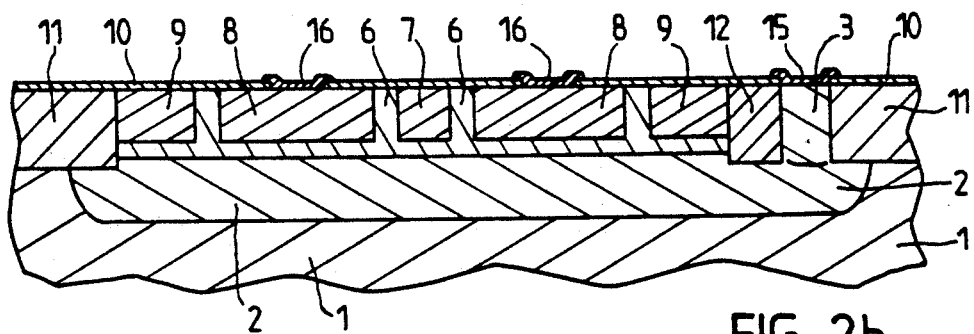

In FIGS. 1, 2a and 2b, a lateral multicollector transistor comprises an emitter 7 (for example of the p type) in the shape of a cross having two branches at right angles to one another, defining four sectors in which four collectors 8 (for example of the p type) are disposed. A base 6 between the emitter branches and the collectors has a width $W_B$. The transistor is realized by the technology of insulation by oxide, for example, by the process known under the designation SUBILO, and its contour, i.e. the contour bounded by the emitter 7 and the collectors 8, is surrounded by a layer 11 of deep oxide, in fact deeper than the base layer so as to form an insulating girdle for the transistor. To prevent the end 7' of the branches seeing the deep oxide 11 through only one portion of the base, which has been found to introduce performance spreads (especially in current gain) of the transistors probably on account of spreads in the quality of the deep oxide 11, an additional region 9 of the same conductivity type as the collectors 8, and forming what might be termed an additional collector, is disposed between the periphery of the transistor and the layer 11 of deep oxide. The additional region may (but need not necessarily) have the same doping level as the collector regions 8 (for example, $10^{19}/cm^3$ or a square resistance of 500 $\Omega$ obtained by the said SUBILO process). Below the assembly is disposed a buried layer 2 which is highly doped, for example n+, in electrical continuity with a layer 3 of the same type and also highly doped, which extends from a main surface of the integrated circuit up to the buried layer. The layer 3 fulfills the function of base contact. The reference numeral 12 indicates the portion of the deep oxide 11 which separates the layer 3 from the additional region 9. As is shown in more detail in FIGS. 2a and 2b, the buried layer 2 is provided below the periphery (as defined above) of the transistor and also below the layer 3 and beyond that in such a way that its junction with the substrate, for example of the p type, terminates at the deep oxide 11.

A layer of thin oxide 10 is disposed on the main surface of the integrated circuit and comprises windows through which contact strips 14 for the emitter, 15 for the base, and 16 for the collector are in electrical contact with these respective zones.

Returning to FIG. 1, the current drawn by the additional region will now be calculated. This region may be considered either solely in its desired function of separating the deep oxide from the ends of the emitter branches, in which case the aim is to minimize the current consumed by it, or also as a supplementary collector, in which case the aim is to give it the desired gain for this application.

It is supposed for the calculations that the transistor is in the amplifier mode, the emitter-base region being forward-biased and the collector-base junction being reverse-biased.

Let us assume that:

$I_c$ is the current which is supposed to be identical in each of the collector regions, $I'$ is the current in the additional region opposite to an emitter end, $\beta_i$ is the current gain in the common emitter for any one of the collector regions, $\beta'$ is the corresponding current gain in the additional region opposite to an emitter end and forming a lateral (pnp) parasitic transistor, $I_{BT}$ is the total base current, $D_E$ is the total length of an emitter branch (a dimension greater than that of an emitter region) and $H_E$ is its width, $W_B$ is the distance between an emitter branch and a collector region (in the case in which this distance is not constant, $W_B$ is the average distance), $W_{B1}$ is the distance (or average distance) between a collector region and the additional region, $W_{B2}$ is the distance between the end of an emitter branch and the additional region, and finally $W'_{B1}$ is the interspacing measured in a longitudinal direction of an emitter branch between an end of a said branch and an extreme edge of a collector region ($W_{B2} = W_{B1} + W'_{B1}$).

It is supposed for a first calculation example that the additional region is brought to a potential which is lower than that of the base.

It is true that:

$$\beta_i = \frac{I_c}{I_{BT}} \text{ and } \beta' = \frac{I'}{I_{BT}}$$

By a first approximation:

$$I_c = hJ_sD_E\left(\exp\frac{V_{BE}}{V_t} - 1\right)$$

in which exp = exponential. The emitter length opposite to an emitter region is effectively equal to approximately $$2 \times \frac{D_E}{2}$$

h = constant (form factor).

with $J_S$ = lateral injection density into the emitter per unit length.

$V_{BE}$ = base-emitter voltage; $V_T$ = 26 mV.

$$I' = h'\frac{W_B}{W_{B2}} H_E J_s\left(\exp\frac{V_{BE}}{V_T} - 1\right)$$

h' = constant (form factor for the additional region). It follows then:

$$\frac{I'}{I_c} = \frac{\beta'}{\beta_i} = \frac{h'}{h} \frac{W_R}{W_{B2}} \frac{H_E}{D_E}$$

Example: $D_E = 45$ μm $H_E = 2$ μm $W_B = 2,5$ μm $W_{B2} = 5$ μm.

in which h'≃h (approximation verified in practice): so $I' = 2,2 \times 10^{-2} I_c$, and the current in the additional region 9 is very weak compared with the currents in the collector regions 8.

It is supposed for a second calculation example that the additional region is connected to the base of the transistor.

The value of the gain $\beta_i$ diminishes and becomes $$\beta'_i = \frac{I_c}{I_{BT} + 4I'}$$

since the current $I'$ corresponding to each of the ends of the emitter in this case contributes to the base current. As a result $$\beta'_i \approx \frac{\beta_i}{1 + 4\beta'}$$

Examples: with the same values as above and $\beta_i = 10$, we have:

$\beta'_i \approx 5,3$.

With the same values as above and $\beta_i = 5$, we have: $\beta'_i \approx 3,5$.

By connecting the additional region to the base, it is possible to avoid the polarization of a supplementary connection (for the additional region), but indeed against a major loss in current gain. It is in this case advantageous to increase $W_{B2}$. For example, if instead of $W_{B2} = 10$ μ, $W_{B2} = 5$ μ is taken, then if $\beta_i = 10$, it follows that $\beta' = 6,9$.

A transistor as described above may be advantageously realized as a high-gain transistor as described in the French Application FR 2.625.611 cited above. The emitter region has such a depth and such a doping level that the diffusion length of the minority carriers injected vertically therein is higher than or equal to the thickness thereof. An electrical connection of the emitter (14) provides at least one zone in electrical contact through at least one window of an insulating layer (10), the ratio between the total surface of the said emitter region and that of the said zone 14 being at least 20, and the ratio between the greatest horizontal dimension (the length $D_E$ in FIG. 1) and the greatest transversal dimension (width $H_E$ in FIG. 1) of at least one branch being at least equal to 5. It will be noted that the branches may have a diamond shape and that several zones 14 may be divided for forming contacts. In that case, however, it is necessary to add together the surfaces of the individual zones 14 to obtain the total surface to be taken into account.

Figure 3:
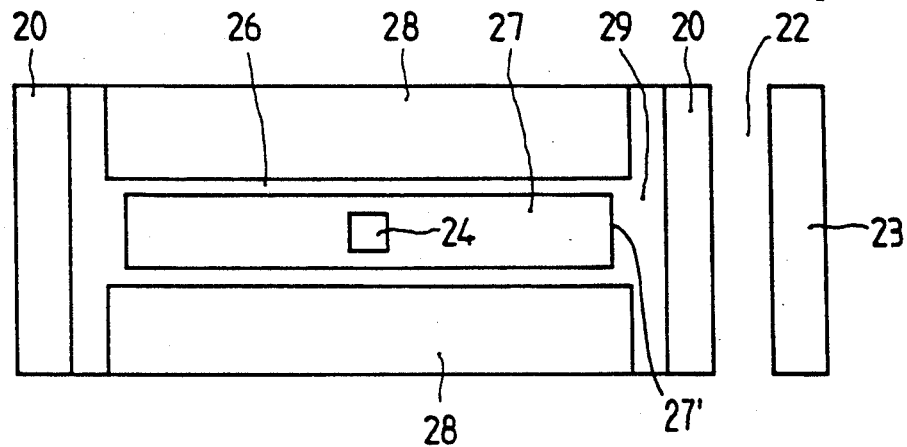
FIG. 3 shows a modification of the invention.

In FIG. 3, the emitter region comprises a prolonged region 27 on either side of which are disposed two collector regions 28. The additional region consists of two parts 20 situated opposite to the ends 27' of the region 27. The expression "opposite to the ends 27'" relates to the transversal as well as to the vertical dimension of the parts 20 in relation to the ends 27'. In other words, a region 20 has a length which is at least equal to the width of the region 27 at the level of its end 27' and a depth at least equal to that of the region 27 at this same level. The two regions 20 may be interconnected (shown in broken lines).

Figure 4:
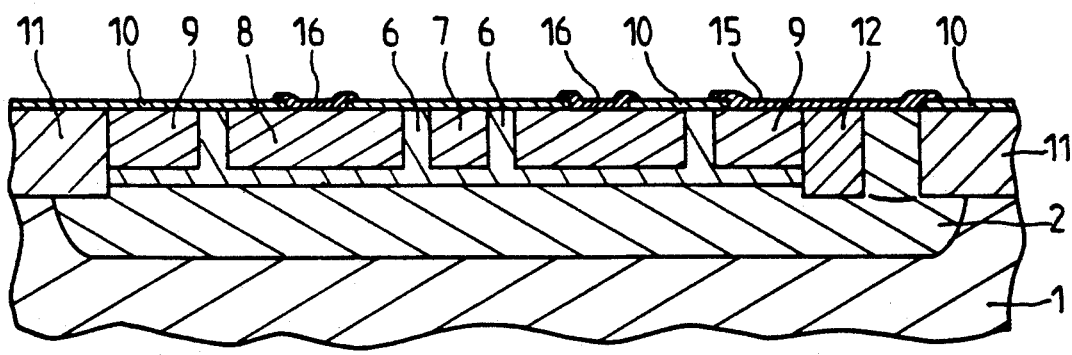
FIG. 4 shows a modification of FIG. 2b.

FIG. 4 shows an electrical connection 15 (for example a metallization layer) interconnecting electrically the additional region 9 and the base (at the contacting level 3).

I claim:

1. An integrated circuit comprising a lateral transistor having laterally spaced emitter and collection regions of a first conductivity type, which regions are provided at a surface in a base region of a second conductivity type opposite to the first, the emitter region having an elongate shape in at least one longitudinal direction and the contour of the lateral transistor being surrounded by a deep insulating layer, wherein the collector region comprises at least two separate zones between which an elongate portion of the emitter region is disposed, an additional region of the first conductivity type is provided bordering the contour of the transistor and disposed between the contour of the transistor and the deep insulating layer and adjacent at least the extremities of said elongate portion of the emitter region, and a distance $W_{B2}$ between the ends of said elongate portion and said additional region is greater than a distance $W_B$ between said elongate portion and said collector zones.

2. An integrated circuit as claimed in claim 1, characterized in that the additional region borders the entire contour of the transistor.

3. An integrated circuit as claimed in claim 1 characterized in that a distance $W_{B1}$ between the collector zones and said additional region is greater than a distance $W_B$ between said elongate portion and said collector zones.

4. An integrated circuit as claimed in claim 1 characterized in that the emitter region has the shape of a cross and comprises two branches disposed in a first and a second longitudinal direction, and in that at least four collector zones are disposed between said branches.

5. An integrated circuit as claimed in claim 1 characterized in that the emitter region has a depth and a doping level such that the diffusion length of the minority carriers injected vertically therein is at least equal to: the thickness of said emitter region.

6. An integrated circuit as claimed in claim 5, characterized in that it comprises at least an electrical emitter connection having at least one zone in electrical contact through at least one window of an insulating layer, the ratio between the total surface of said emitter region and that of said electrical emitter connection zone being at least 20, and the ratio between the greatest horizontal dimension ($D_E$) and the greatest transversal dimension ($H_E$) of at least one said branch being at least equal to 5.

* * * * *